(12) United States Patent
Park (10) Patent No.: US 7,317,223 B2
(45) Date of Patent: Jan. 8, 2008

(54) MEMORY DEVICE AND METHOD OF MANUFACTURING THE SAME

(75) Inventor: Weon-Ho Park, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 125 days.

(21) Appl. No.: 11/140,298

(22) Filed: May 26, 2005

(65) Prior Publication Data

US 2005/0263815 A1 Dec. 1, 2005

(30) Foreign Application Priority Data

May 27, 2004 (KR) ...................... 10-2004-0037656

(51) Int. Cl.
*H01L 29/792* (2006.01)
(52) U.S. Cl. ...................... 257/326; 257/315; 257/393; 257/E27.013; 257/E27.066
(58) Field of Classification Search ................. 257/326
See application file for complete search history.

(56) References Cited

U.S. PATENT DOCUMENTS

| | | | | |
|---|---|---|---|---|
| 5,858,826 | A * | 1/1999 | Lee et al. ................... | 438/228 |
| 6,309,921 | B1 * | 10/2001 | Ema et al. ................... | 438/228 |
| 6,545,310 | B2 | 4/2003 | Li et al. | |
| 6,803,630 | B2 * | 10/2004 | Pio et al. ..................... | 257/345 |
| 6,862,223 | B1 * | 3/2005 | Lee et al. ............... | 365/185.33 |
| 2004/0140485 | A1 * | 7/2004 | Matsuzaki et al. .......... | 257/208 |
| 2005/0047213 | A1 * | 3/2005 | Umezawa ............... | 365/185.28 |
| 2005/0052918 | A1 * | 3/2005 | Dormans et al. ........... | 365/222 |

FOREIGN PATENT DOCUMENTS

| | | |
|---|---|---|
| JP | 2001-210808 | 8/2001 |
| JP | 2003-204000 | 7/2003 |
| KR | 1992-0015541 | 8/1992 |

OTHER PUBLICATIONS

English language abstract of Japanese Publication No. 2001-210808.
English language abstract of Japanese Publication No. 2003-204000.
Standards Committee of the IEEE electron Devices Society "IEEE Standard Definitions and Characterization of Floating Gate Semiconductor Arrays" IEEE std 1005-1998, 129 pages.
English language abstract of Korean Publication No. 1992-0015541.

* cited by examiner

*Primary Examiner*—Tu-Tu Ho
(74) *Attorney, Agent, or Firm*—Marger Johnson & McCollom, P.C.

(57) ABSTRACT

In one embodiment, a memory device includes a semiconductor substrate, a first region formed in a predetermined region of the semiconductor substrate, and in which a plurality of memory transistors are disposed, and a second region adjacent to the first region, and in which a selection transistor is formed to supply a predetermined voltage to the memory transistor. The second region of the substrate may have a higher impurity concentration than an entire region of the substrate other than the second region. Reduced area of the selection transistor can be realized with a shortened channel length, without a decreased threshold voltage.

3 Claims, 9 Drawing Sheets

MEMORY DEVICE AND METHOD OF MANUFACTURING THE SAME

BACKGROUND OF THE INVENTION

This application claims the priority of Korean Patent Application No. 2004-37656, filed on May 27, 2004, in the Korean Intellectual Property Office, the disclosure of which is incorporated herein in its entirety by reference.

1. Field of the Invention

The present invention relates to a nonvolatile memory device and a method of manufacturing the same, and more particularly, to a memory device such as an Electrically Erasable Programmable Read Only Memory (hereinafter, referred to as "EEPROM") device, and a method of manufacturing the same.

2. Description of the Related Art

As known in the art, unlike a dynamic random access memory and a static random access memory, a nonvolatile memory device refers to a device in which data is not erased even when the power supply is not connected. In an EEPROM device of the nonvolatile memory device, a higher voltage is applied to its gate to perform programming and erasure operations. In more detail, the programming and the erasure of the EEPROM device are performed by an F-N tunneling wherein electrons tunnel through a tunnel oxide film formed in a portion of a channel region. The EEPROM device is disclosed in "IEEE Standard Definitions and Characterization of Floating Gate Semiconductor Arrays (IEEE std 1005-1998)."

The EEPROM device can perform the erasure in one byte unit, that is, in an eight-bit unit. The EEPROM device includes a selection transistor at each of the bytes to erase each of the bytes.

Figure 1:
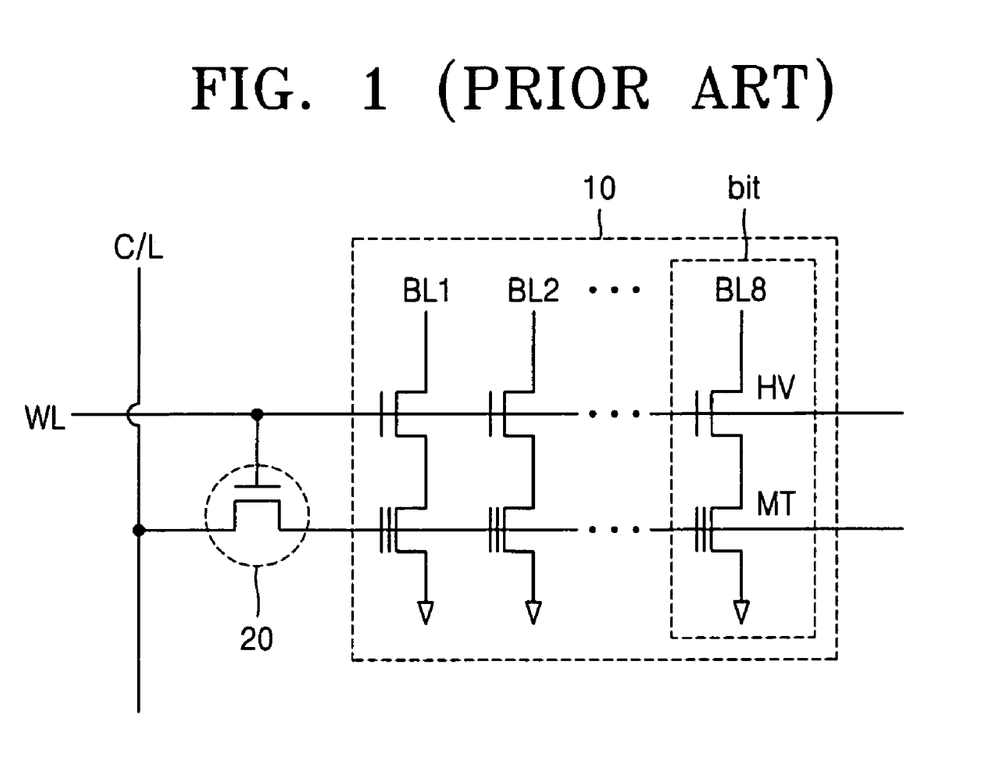
FIG. 1 is a circuit diagram illustrating a general EEPROM device.

FIG. 1 is a circuit diagram schematically illustrating a general EEPROM device for performing the erasure operation at each of the bytes.

As shown in FIG. 1, a unit cell of the EEPROM device includes a memory cell block 10 comprised of one byte (eight unit-bits), and a selection transistor 20 to select the memory cell block 10.

The memory cell block 10 is comprised of eight unit-bits as described above, and the unit bit is comprised of a high voltage transistor (HV) for switching a signal of bit lines BL1-BL8 when a word line WL is selected, and a memory transistor (MT) to operate when the selection transistor 20 is switched. At this time, the memory transistor (MT) substantially refers to the EEPROM device, and includes a tunneling oxide film, a floating gate electrode and a control gate electrode.

The selection transistor 20 transmits a signal from the control line (C/L) to the memory transistor (MT) when the word line (WL) is selected. At this time, it is important that the selection transistor 20 is designed to have almost 0V of a threshold voltage and a body effect to transmit a majority of voltage of the control line (C/L) to the memory transistor (MT) without a voltage drop. In a conventional art, the selection transistor 20 is formed in a bare semiconductor substrate, for example, in a P-type semiconductor substrate to have almost 0V of the threshold voltage and the body effect.

It is also required that the EEPROM device be formed in a narrower area due to the high integration of the semiconductor device. Accordingly, a conventional method of reducing an area of the memory cell block 10 to reduce the area of the EEPROM device has been proposed. In other words, in the conventional EEPROM device, the memory cell block 10 occupies an area of about 40 to 120 μm$^2$, and the selection transistor 20 occupies an area of about 10 to 15 μm$^2$, which is very small in comparison with the memory cell block 10. Therefore, efforts have been exacted to reduce the area of the memory cell block 10 occupying most of the EEPROM device.

Currently, due to the remarkable development of a photolithography process, a unit bit of the memory cell block 10 can be reduced up to 1.0 to 3.0 μm$^2$ in area, and the memory cell block 10 can be also reduced up to 10 to 25 μm$^2$ in area.

If the memory cell block 10 is reduced in area, the selection transistor 20 occupies an area that is never negligible in the EEPROM device. It is required that the selection transistor 20 be reduced in area to manufacture a highly integrated EEPROM device.

A conventional method of reducing the channel length of the selection transistor 20 has been proposed to reduce the area of the selection transistor 20.

However, if the channel length of the selection transistor 20 is reduced during a state when gate and drain voltages (word line voltage and control line voltage) are applied, a high electric field is formed in the channel region, thereby reducing the threshold voltage of the selection transistor 20, and generating a leakage current in a junction region.

Due to the reduction of the threshold voltage and the generation of the leakage current in the selection transistor 20, the selection transistor 20 is turned on in an unwanted state undesirably. Accordingly, the memory transistor (MT) can be erroneously operated.

SUMMARY OF THE INVENTION

In one embodiment, a memory device such as an EEPROM (Electrically Erasable Programmable Read Only Memory) device includes: a semiconductor substrate; a first region formed in a predetermined region of the semiconductor substrate, and in which a plurality of memory transistors are disposed; and a second region formed adjacent to the first region, and in which a selection transistor is formed to supply a predetermined voltage to at least one of the pluralities of memory transistors. At this time, the second region of the substrate may have a higher impurity concentration than the first region.

According to another embodiment of the present invention, a memory device includes: a semiconductor substrate; a cell block region which is formed in a predetermined region of the semiconductor substrate, and in which a plurality of memory transistors is provided in a byte unit; and a selection transistor region in which selection transistors are provided to switch the memory transistors provided in the byte unit. At this time, a well is formed in the selection transistor region of the semiconductor substrate.

According to yet another embodiment of the present invention, a memory device includes: a P-type silicon substrate; a cell block region which is formed in a predetermined region of the silicon substrate, and in which a plurality of memory transistors is provided in a byte unit; and a selection transistor region in which a plurality of selection transistor is provided to switch the memory transistors, the selection transistors having reduced line widths and being provided for each of the memory transistors. At this time, a P-well is formed in at least one of the cell block region and the selection transistor region.

The P-type silicon substrate may have an impurity concentration in the range of about 4.0 to about 5.0×10$^{14}$/cm$^3$, and the P-well may have an impurity concentration in the range of about $10^{17}$ to about $10^{20}/cm^3$. The P-well may have a depth in the range of about 1 to about 3 μm.

The memory transistor may be comprised of eight memory transistors serially connected.

A high voltage transistor is further provided in the cell block region, and is connected in series to one of the memory transistors.

The memory transistor includes: a floating gate electrode which is formed on the silicon substrate; a control gate electrode formed on the floating gate electrode; an inter-gate-electrode oxide film interposed between the control gate electrode and the floating gate electrode; a tunnel dielectric film and a gate dielectric film interposed between the silicon substrate and the floating gate electrode; and a cell junction region formed in the semiconductor substrate below the floating gate electrode.

The selection transistor includes: a gate electrode which is formed on the semiconductor substrate; source and drain regions formed in a P-well region at both sides of the gate electrode; and a gate dielectric film interposed between the semiconductor substrate and the gate electrode.

The gate electrode of the selection transistor is formed of a layered film of material forming the floating gate electrode and material forming the control gate electrode of the memory transistor. The selection transistor has an area in the range of about 5 to about 7 μm².

According to still another embodiment of the present invention, a method of manufacturing a memory device includes: forming a device isolation layer in a P-type semiconductor substrate having a cell block region and a selection transistor region; forming a P-well in the selection transistor region; and forming a memory transistor in the cell block region and forming a selection transistor in the selection transistor region.

According to still another embodiment of the present invention, a method of manufacturing a memory device includes: forming a device isolation layer in a P-type semiconductor substrate having a cell block region and a selection transistor region; forming P-wells commonly having the same impurity concentration, in the cell block region and the selection transistor region; and forming a memory transistor in the cell block region and forming a selection transistor in the selection transistor region.

According to still another embodiment of the present invention, a method of manufacturing a memory device includes: forming a device isolation layer in a P-type semiconductor substrate having a cell block region and a selection transistor region; selectively forming a first P-well in the cell block region; form a second P-well in the selection transistor region; and forming a memory transistor in the cell block region and form a selection transistor in the selection transistor region. At this time, the first and second P-wells have different impurity concentrations.

BRIEF DESCRIPTION OF THE DRAWINGS

The above and other features and advantages of the present invention will become more apparent by describing in detail exemplary embodiments thereof with reference to the attached drawings.

DETAILED DESCRIPTION OF THE PREFERRED EMBODIMENTS

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Like reference numerals in the drawings denote like elements, and thus their description will be omitted.

It is characterized that the present invention reduces a channel length of a selection transistor to reduce an area of the selection transistor and at the same time, increases an impurity concentration of a semiconductor substrate to form the selection transistor therein to reduce a drop of a threshold voltage and generation of a leakage current.

As known in the art, the threshold voltage correlates with the impurity concentration of the semiconductor substrate as follows.

$$Vt = Vfb + 2\varphi B + \frac{\sqrt{2\varepsilon siqNa(2\varphi B + Vbs)}}{Cox} \quad \text{(Equation 1)}$$

where, Vt: threshold voltage

Na: substrate impurity concentration

Since the threshold voltage Vt is functionally proportional to the substrate impurity concentration (Na) in Equation 1, the substrate impurity concentration can be increased to compensate for a reduced threshold voltage due to, say, a reduced channel length.

Further, it is characterized that the present invention forms the selection transistor in a well having an optimal impurity concentration to compensate the threshold voltage caused by the reduction of the channel length of the selection transistor.

The present invention reduces the channel length of the selection transistor to reduce the area of an EEPROM device, and increases the impurity concentration of the semiconductor substrate having the selection transistor to reduce the drop of the threshold voltage caused by the reduction of the channel length, and the generation of the leakage current. As the impurity concentration of the semiconductor substrate is increased, the threshold voltage is compensated, thereby reducing the leakage current. Accordingly, a memory transistor driven by the selection transistor can be prevented from being erroneously operated.

Hereinafter, the EEPROM device having the above characteristics is described in more detail.

Figure 2:
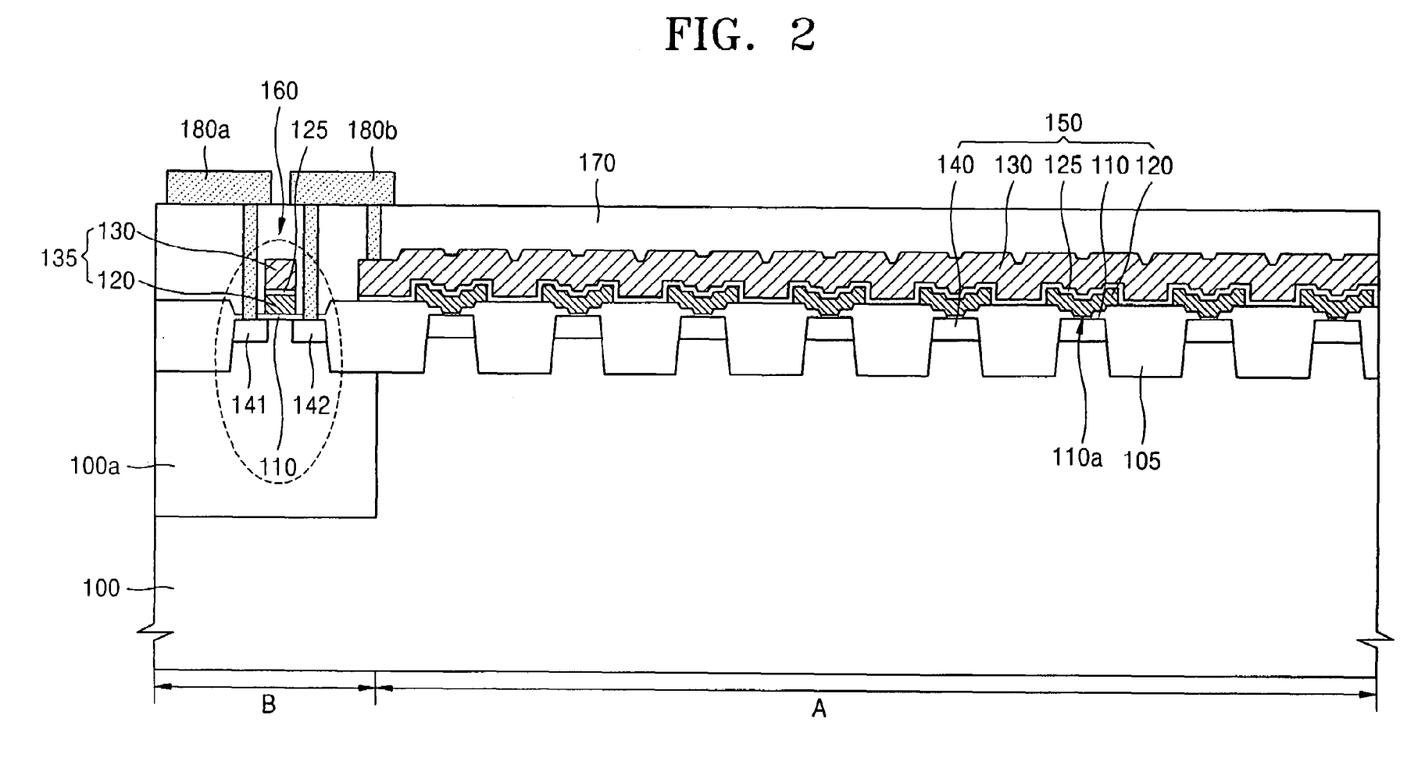
FIG. 2 is a cross-sectional view illustrating an EEPROM device according to an embodiment of the present invention.

As shown in FIG. 1, an EEPROM device includes a cell block region having a plurality of memory transistors, and the selection transistor to drive the cell block region. The cell block region and the selection transistor are integrated in the semiconductor substrate 100 as shown in FIG. 2. In the embodiment of FIG. 2, the cell block region is denoted by a reference numeral "A", and a region for forming the selection transistor (hereinafter, referred to as "selection transistor region") is denoted by a reference numeral "B".

In this embodiment of FIG. 2 the semiconductor substrate 100 having the cell block region (A) and the selection transistor region (B) is a P-type silicon substrate, and the semiconductor substrate 100 can have an impurity concentration of about 4.0 to about $5.0 \times 10^{14}/cm^3$. A device isolation layer 105 can be formed to define an active region in the cell block region (A) and the selection transistor region (B). The device isolation layer 105 can be formed using a Shallow Trench Isolation (STI) technique, for example. Specifically, the device isolation layers 105 of the cell block region A may be spaced apart from each other at a distance to allow the active region to have a finger shape.

As shown in the embodiment of FIG. 2, a plurality of high-voltage transistors and a plurality of memory transistors can be formed in the cell block region A. In FIG. 2, only the plurality of memory transistors 150 are illustrated.

Figure 3:
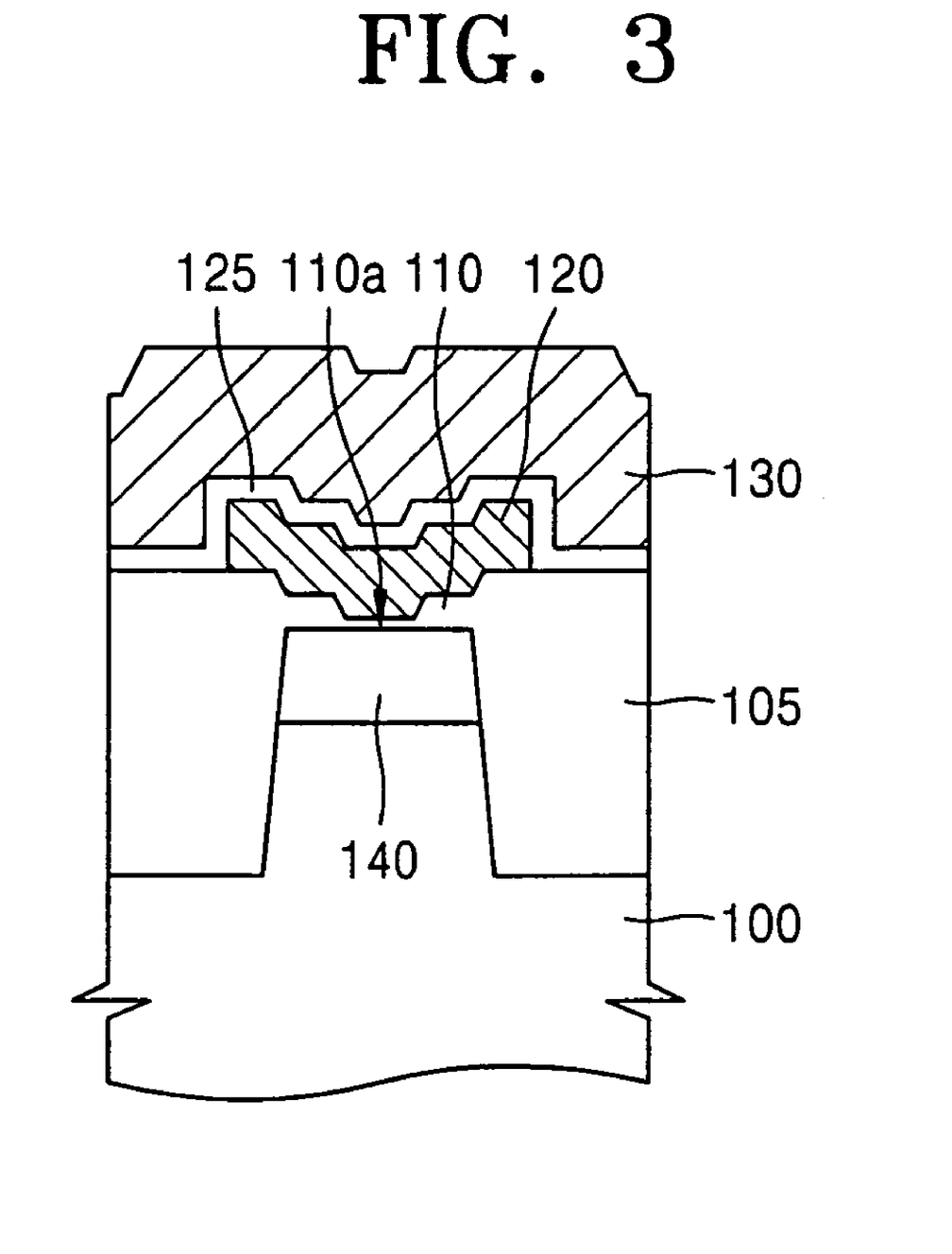
FIG. 3 is an enlarged sectional view illustrating a memory transistor of FIG. 2.

As illustrated in FIGS. 2 and 3, the memory transistor 150 includes a floating gate electrode 120 formed in the active region between the device isolation layers 105; an inter-gate-electrode insulating film 125 formed on the floating gate electrode 120; and a control gate electrode 130 formed on the inter-gate-electrode insulating film 125. The floating gate electrode 120 and the control gate electrode 130 may be a doped polysilicon film, for example. The inter-gate-electrode insulating film 125 can be formed of an Oxide-Nitride-Oxide (ONO) film, for example. A gate dielectric film 110 is interposed between the semiconductor substrate 100 and the floating gate electrode 120. The gate dielectric film 110 includes a tunneling region 110a having a relatively small thickness in the active region. As known in the art, charges are moved to the floating gate electrode 120 through the tunneling region 110a. A cell junction region 140 is formed in the active region, which is disposed below the floating gate electrode 120. At this time, eight floating gate electrodes 120 and one control gate electrode 130 covering the floating gate electrodes 120 are formed in one cell block region A.

The memory transistor 150 of the EEPROM device may have an improved programming and erasing efficiency to improve the programming and erasing characteristic as follows.

The erasing efficiency $\alpha_e$ is expressed in the following Equation 2.

$$\alpha_e = \frac{Cono}{Ctun + Cono + Cgox} \qquad \text{(Equation 2)}$$

where Cono is the capacitance between the floating gate electrode 120 and the control gate electrode 130

Ctun is the capacitance between the floating gate electrode 120 and the substrate 100 in the tunneling region 110a Cgox is the capacitance between the substrate 100 and the floating gate electrode 120

According to the above Equation 2, Cono should be increased to improve the erasing efficiency $\alpha_e$. For this, the inter-gate-electrode insulating film 125 should have a decreased thickness. Currently, due to the development of a deposition technique, the inter-gate-electrode insulating film 125 thickness can be decreased enough to improve the erasing efficiency $\alpha_e$.

In the meantime, the programming efficiency $\alpha_p$ is expressed in the following Equation 3.

$$\alpha_p = 1 - \frac{Ctur}{Ctun + Cono + Cgox} \qquad \text{(Equation 3)}$$

According to the Equation 3, the $C_{tun}$ should be decreased to improve the programming efficiency $\alpha_p$. For this, a line width of the tunneling region 110a should be reduced. Currently, due to the development of a photolithography process, the line width of the tunneling region 110a can be reduced enough to improve the programming efficiency. As the erasing efficiency and the programming efficiency are improved, the switching characteristic of the memory transistor 150 can be greatly improved.

On the other hand, a selection transistor 160 is formed in the selection transistor region B. The selection transistor 160 includes a gate electrode 135, and source and drain regions 141 and 142 disposed on both sides of the gate electrode 135. The gate electrode 135 of the selection transistor 160 includes a floating gate electrode 120 and a control gate electrode 130. The inter-gate-electrode insulating film 125 is interposed between the floating gate electrode 120 and the control gate electrode 130 in the selection transistor 160 as in the memory transistor. The gate dielectric film 110 is interposed between the gate electrode 135 and the semiconductor substrate 100.

In this embodiment, the line width of the gate electrode 135 is reduced to a predetermined length to reduce an area occupied by the selection transistor 160. For example, the line width of the gate electrode 135 of the selection transistor 160 is reduced by about half in comparison with the conventional art so that the selection transistor 160 has a total occupation area of 5 to 7 $\mu m^2$, and may have a total occupation area of about 6 $\mu m^2$.

As known in the art, if the area of the selection transistor 160, that is, the line width (channel length) of the gate electrode of the selection transistor 160 is reduced, the threshold voltage Vt of the selection transistor 160 is reduced by a short channel effect. If the threshold voltage Vt is reduced, the selection transistor 160 is undesirably turned on, thereby causing the memory transistor 150 of the cell block region A to erroneously operate.

To solve the above drawbacks, this embodiment selectively increases an impurity concentration of the semiconductor substrate 100 region (selection transistor region: B) in which the selection transistor 160 is formed. That is, as described in Equation 1, the threshold voltage Vt is proportional to the impurity concentration (Na) of the substrate 100. Accordingly, if the impurity concentration (Na) of the substrate 100 region forming the selection transistor 135 therein is increased by a predetermined amount, the reduced threshold voltage Vt can be compensated.

In an embodiment of the present invention, to increase the impurity concentration of the selection transistor region B, a P-well 100a is selectively formed in the selection transistor region B as shown in FIG. 2. At this time, the P-well 100a may have an optimal impurity concentration to allow about 0.5 to about 1V for the threshold voltage Vt, and can have a depth of about 1 to about 3 µm.

Figure 4:
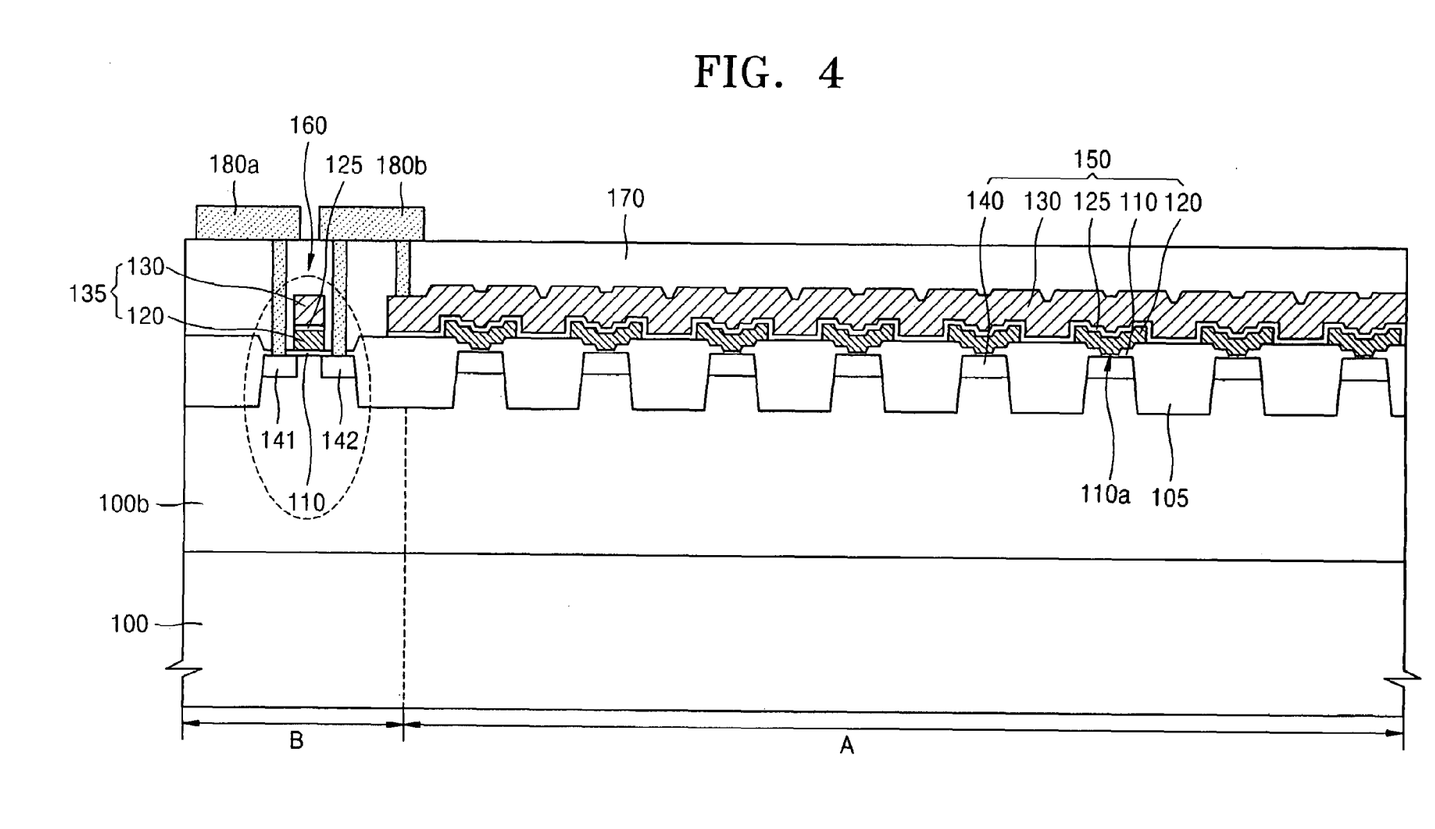
FIG. 4 is a cross-sectional view illustrating an EEPROM device according to another embodiment of the present invention.

Referring to FIG. 4, in another embodiment, to increase the impurity concentration of the selection transistor region B, a P-well 100b is commonly formed in the cell block region A and the selection transistor region B as shown in FIG. 4. At this time, the P-well 100b has an impurity concentration, which is higher than the substrate 100 and allows the memory transistor 150 of the cell block region A to perform an optimal operation. In this case, the P-well 100b can have the impurity concentration of about $10^{17}$ to about $10^{20}/cm^3$. In the above impurity concentration of the P-well 100b, the selection transistor 160 can have about 0.5 to about 1.1V for the threshold voltage Vt, and can have the depth of about 1 to about 3 µm.

At this time, the P-well 100b can be commonly formed to have the same impurity concentration in the cell block region A and the selection transistor region B as shown in FIG. 4.

Figure 5:
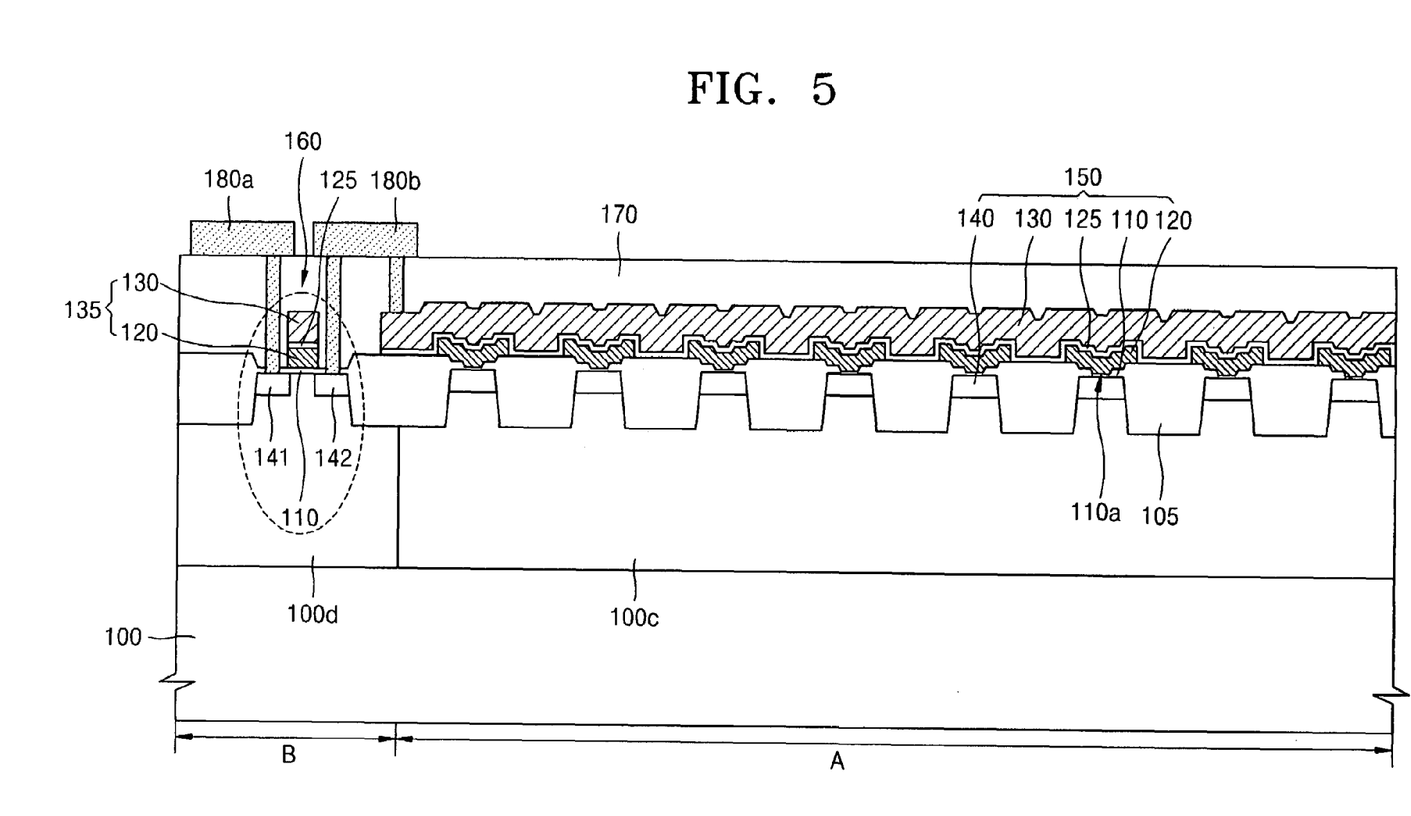
FIG. 5 is a cross-sectional view illustrating an EEPROM device according to yet another embodiment of the present invention.

Now referring to FIG. 5, P-wells 100c and 100d can be respectively formed in the cell block region A and the selection transistor region B. The P-well 100c formed in the cell block region A and the P-well 100c formed in the selection transistor region B can have different impurity concentrations. In this case, the P-well 100c formed in the cell block region A may have the impurity concentration to allow the optimal switching operation of the memory transistor 150. The P-well 100d formed in the selection transistor region B may have the impurity concentration to allow about 0.5 to about 1.1V for the threshold voltage.

Even though the threshold voltage Vt of the selection transistor 160 is above 0.5V as described above, the memory transistor 150 is normally operated due to the improvement on the switching characteristic of the memory transistor 150 compared to the prior art. In other words, since the erasing efficiency and the programming efficiency are improved due to the development of a semiconductor manufacturing process, the memory transistor 150 is normally operated even though an applied voltage is a little less than the conventional art, that is, even though an applied voltage refers to an increased threshold voltage.

After that, an interlayer insulating film 170 is formed on the resultant semiconductor substrate 100. Metal wires 180a and 180b are formed on the interlayer insulating film 170 to be in contact with the source and drain 141 and 142 of the selection transistor 150, respectively. At this time, the metal wire 180b allows the drain 142 (or source) of the selection transistor 160 to be electrically connected with the control gate 130 of the memory transistor 150.

In the following Table 1, the inventive EEPROM device and the conventional EEPROM device are compared in a decreased ratio of area. Here, the memory transistor 150 has a unit area set to (A)µm² and the selection transistor 160 has a unit area set to (B) µm², which is decreased by a half in comparison with the conventional art. Further, an area of a selection transistor is set to (C) µm² in the conventional art. In this particular example of an embodiment, A=2.8, B=6, and C=12.

TABLE 1

| | Inventive EEPROM device | Conventional EEPROM device |
|---|---|---|
| Total area of selection transistor and one byte memory transistor | B µm² + (A) × 8 µm² = 28.4 µm² | C µm² + (A) × 8 µm² = 34.4 µm² |
| Effective area of unit cell | 28.4/8 = 3.55 µm² | 34.4/8 = 4.3 µm² |
| Effective ratio of area reduction of unit cell | (3.55/4.3) × 100 = 82.6% | |

According to Table 1, a total effective area of the unit cell of the inventive EEPROM device is greatly decreased due to the area reduction of the selection transistor. Accordingly, the inventive EEPROM device is decreased in size, while the memory cell transistor can be prevented from being erroneously operated.

FIGS. 6 through 9 are sectional views illustrating a method of manufacturing the EEPROM device according to an embodiment of the present invention.

Figure 6:
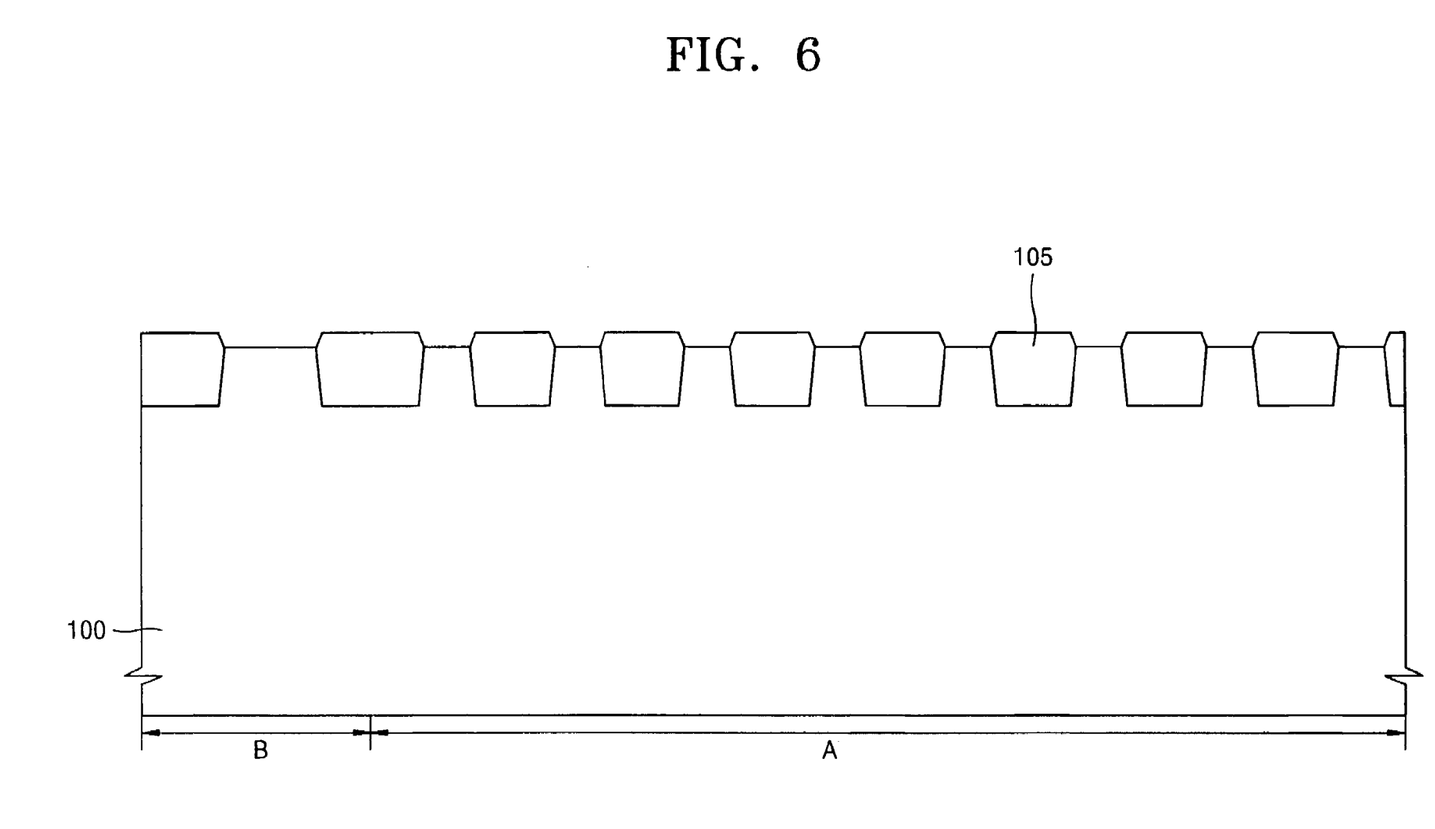
FIGS. 6 through 9 are sectional views illustrating a method of manufacturing an EEPROM device according to an embodiment of the present invention.

First, as shown in FIG. 6, the device isolation layer 105 is formed using a conventional STI technique to form the active region in a predetermined portion of the semiconductor substrate 100 having the cell block region A and the selection transistor B, that is, in the P-type silicon substrate.

Figure 7:
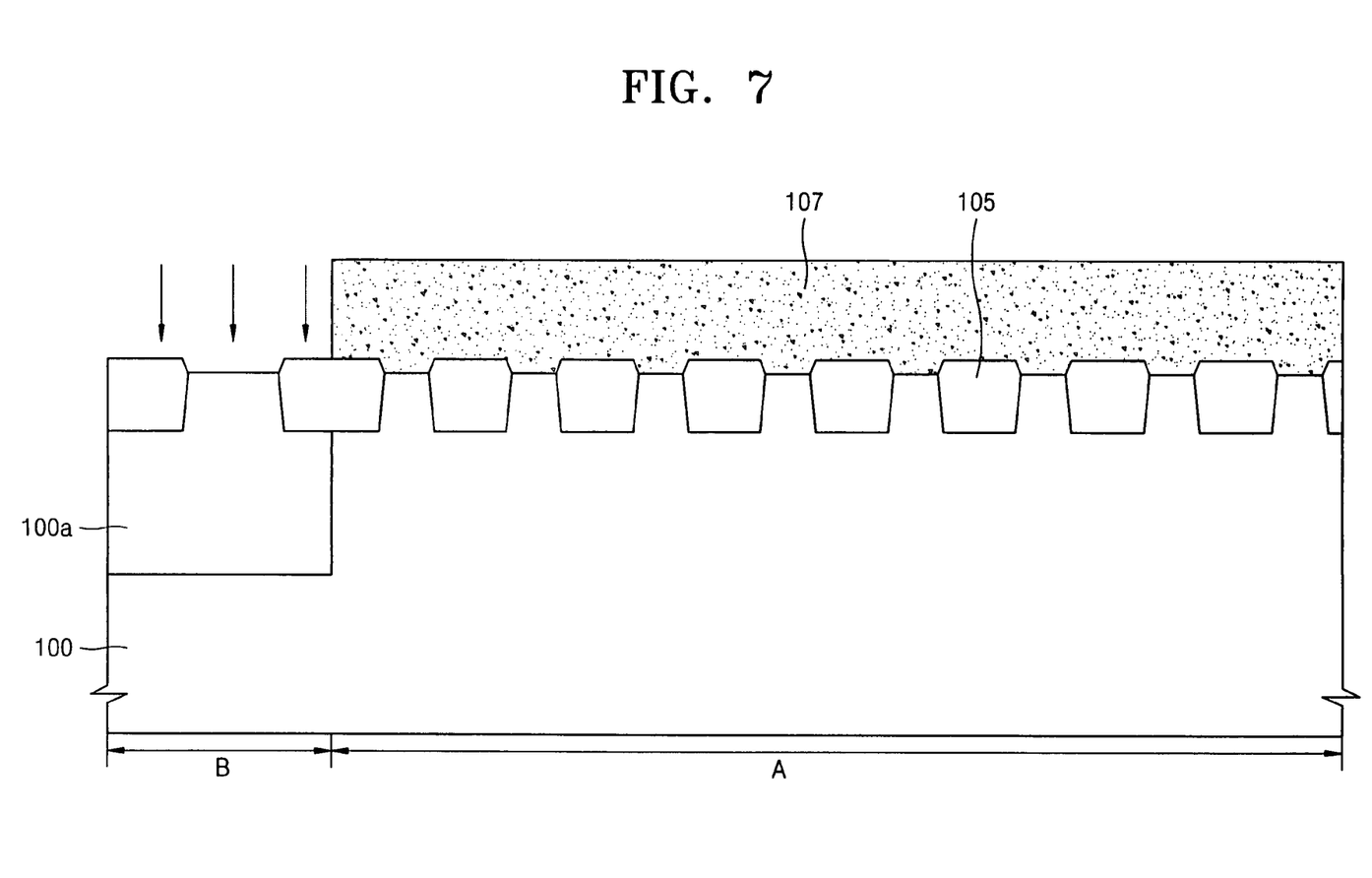
Figure 8:
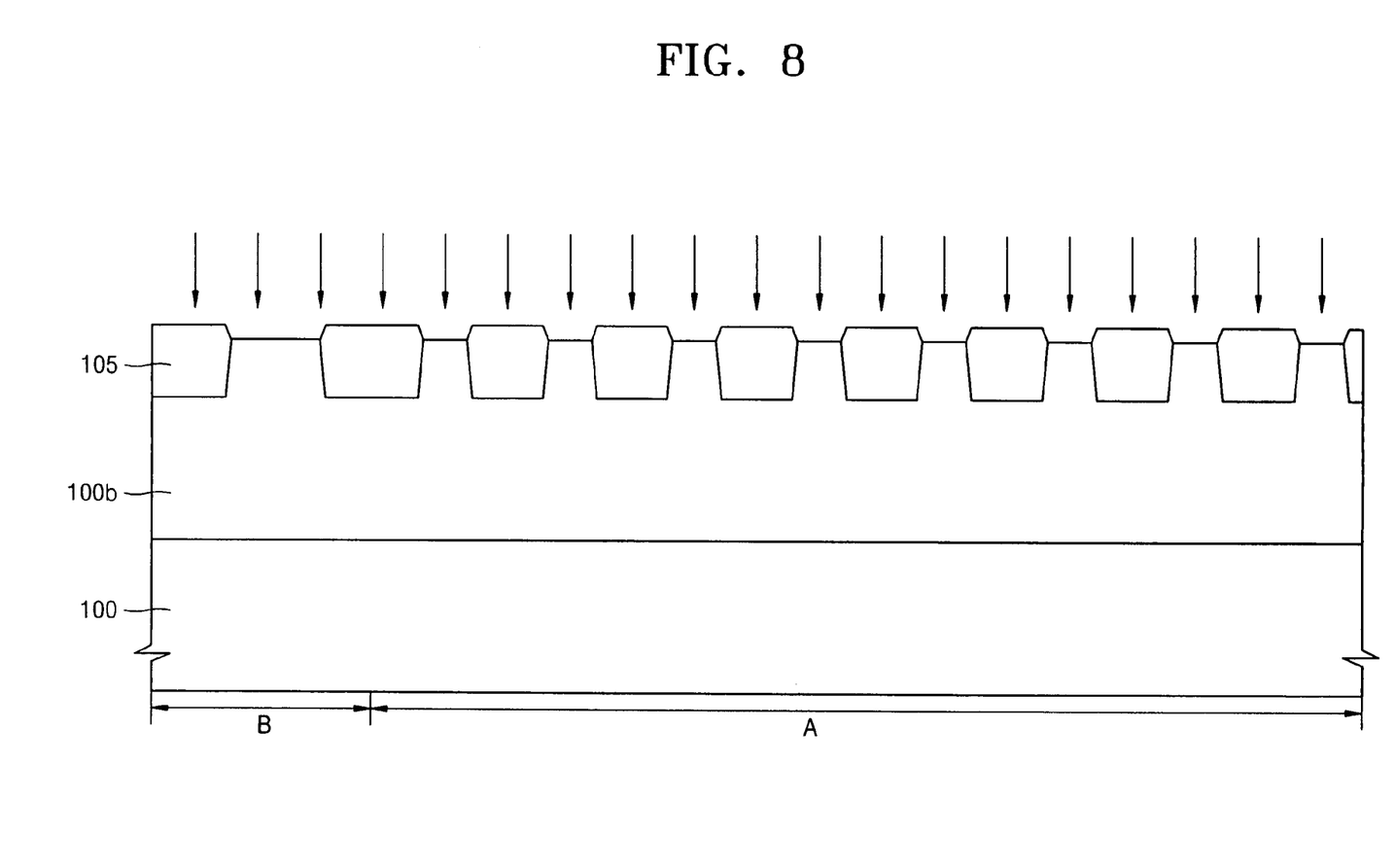
Figure 9:
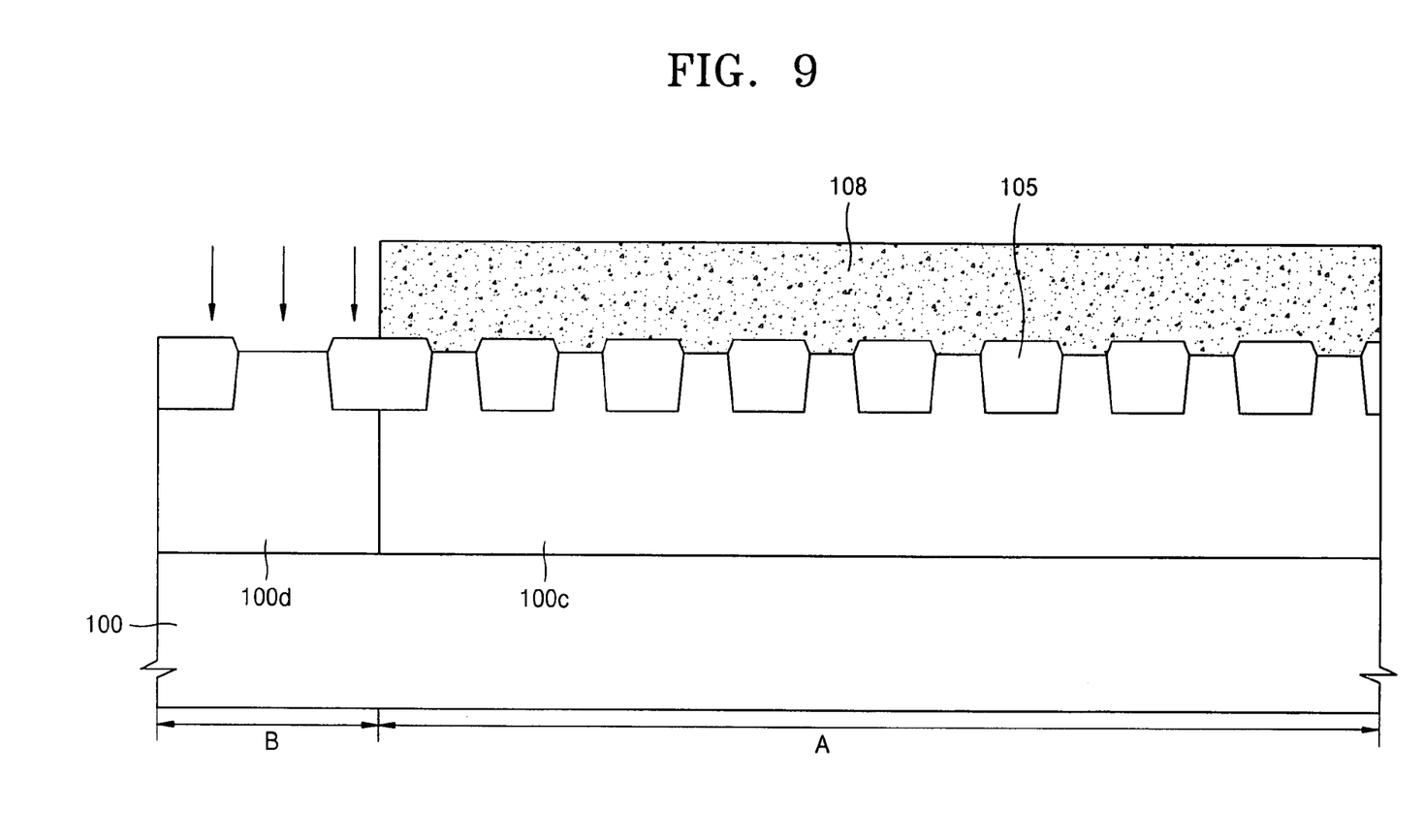

Next, to form the P-well in the selection transistor region (B) as shown in FIG. 2, a photoresist pattern 107 is formed using a known photolithography process to expose the selection transistor region B as shown in FIG. 7. After that, P-type impurities, for example boron impurities, are injected into the exposed selection transistor region (B) at a predetermined depth, and then are annealed to form the P-well 100a. In this embodiment, the selection transistor region (B) can have the optimal impurity concentration to control the threshold voltage (Vt) to be about 0.5 to about 1.0V.

Further, to commonly form the P-well in the cell block region (A) and the memory transistor region (B) as shown in FIG. 4, P-type impurities can be injected at a predetermined length into the semiconductor substrate 100 having the device isolation layer 105, and then annealed to commonly form the P-well 100b. At this time, the P-well 100b may have the impurity concentration to optimally operate the memory transistors. In this case, the threshold voltage of the selection transistor 160 can rise more than 0V, but the memory transistor 150 can be normally operated even at the threshold voltage of more than 0V due to the improvement on the switching characteristic of the memory transistor 150. In this case, since the P-well 100b is commonly formed in the cell block region (A) and the memory transistor region (B), the manufacturing process does not require the photoresist pattern for selectively masking the cell block region (A) and the memory transistor region (B), and a plurality of implantation processes. Accordingly, the manufacturing process can be simplified.

In the meantime, to respectively form the P-wells in the cell block region (A) and the memory transistor region (B) as shown in FIG. 5, a photoresist pattern (not shown) is formed to expose the cell block region (A) and then, the P-type impurities are injected to a predetermined concentration into the exposed cell block region (A) and annealed to form the first P-well 100c. The first P-well 100c may have an impurity concentration to operate the memory transistor 150 (FIG. 5) in an optimal state. After that, the first photoresist pattern is removed, and then a second photoresist pattern 108 is formed on the semiconductor substrate 100 to expose the selection transistor region (B). The P-type impurities are injected and annealed to a predetermined impurity concentration in the exposed selection transistor region (B)

to form the second P-well 100*d*. The second P-well may have a impurity concentration so that the selection transistor 160 (FIG. 5) has about 0.5 to 1.0V for the threshold voltage. At this time, the first P-well 100*c* and the second P-well 100*d* can be formed in a reverse sequence. This embodiment increases the number of the processes in comparison with the above-described embodiment, but has an advantage in that the optimal impurity concentration can be respectively provided in the cell block region (A) and the selection transistor region (B).

As shown in FIGS. 2, 4 and 5, a gate dielectric film 110 is formed on the semiconductor substrate 100 having the P-well, and the tunneling region 110*a* is formed in a predetermined portion of the cell block region (A) to define the tunneling oxide film. Next, the floating gate electrode material is deposited and patterned to form the floating gate electrode 120 in the cell block region (A), and to form the lower gate electrode 120 in the selection transistor region (B). After that, the inter-gate-electrode insulating film 125, for example the ONO oxide film, is selectively deposited only into the cell block region (A). After that, the control gate electrode material is deposited and patterned on the resultant semiconductor substrate 100 to form the control gate electrode 130 in the cell block region (A) and to form the upper gate electrode 130 in the selection transistor region (B). At this time, the inter-gate insulating film 125 can be also formed on the selection transistor region (B). In this case, the lower gate electrode (floating gate material: 120) should be connected with the upper gate electrode (control gate electrode material: 130) so that they can be electrically contacted in the selection transistor region (B). Impurities, for example, N-type impurities are injected into the active region of the selection transistor region (B) and the cell block region (A) to form the cell junction region 140 in the cell block region (A) and to form the source and drain regions 141 and 142 in the selection transistor region (B). At this time, the cell junction region 140 may be formed before the formation of the tunnel oxide film. The interlayer insulating film 170 is formed on the resultant semiconductor substrate, and is etched to expose the source and drain regions 141 and 142 and the control gate electrode 130. After that, the first metal wire is formed to be in contact with the source region on the interlayer insulating film 170, and the second metal wire is formed to electrically connect the drain region with the control gate electrode 130.

As described above, according to an aspect of the present invention, the impurity concentration of the substrate region forming the selection transistor therein is relatively increased to reduce the area of the selection transistor to operate the memory transistors in the byte unit. Accordingly, the size of the EEPROM device can be reduced, and can compensate for the reduced area of the selection transistor (that is, the reduction of the threshold voltage caused by the reduction of the channel length) to prevent the memory transistor from being erroneously operated.

Embodiments of the invention will now be described in a non-limiting way.

According to an aspect of the invention, a memory device comprises a semiconductor substrate. A first region is defined in a region of the semiconductor substrate and has a plurality of memory transistors disposed thereon. A second region is formed to a predetermined depth in the semiconductor substrate from a top surface thereof. The second region is disposed adjacent to the first region. The second region has a selection transistor to supply a predetermined voltage to at least one of the pluralities of memory transistors thereon. The second region of the substrate has a higher impurity concentration than the region of the substrate below the predetermined depth.

According to another aspect of the invention, a memory device comprises a semiconductor substrate and a cell block region formed in a predetermined region of the semiconductor substrate, the cell block region having a plurality of memory transistors provided thereon in a byte unit, and a selection transistor region having selection transistors provided thereon to switch the memory transistors. A well is located in the selection transistor region of the semiconductor substrate.

According to yet another aspect of the invention, a memory device comprises a P-type silicon substrate and a cell block region formed in a predetermined region of the silicon substrate. The cell block region has a plurality of memory transistors provided thereon in a byte unit. The memory device includes a selection transistor region having a plurality of selection transistors provided thereon to switch the memory transistors. The selection transistors are provided for each of the plurality of memory transistors. A P-well is formed in at least one of the cell block region and the selection transistor region.

According to still another aspect of the invention, a memory device comprises a semiconductor substrate, a first region defined in a portion of the semiconductor substrate, the first region having a plurality of memory transistors disposed thereon, and a second region formed to a predetermined depth in the semiconductor substrate from a top surface thereof, the second region thereby defining the first region in the semiconductor substrate and having a selection transistor to supply a predetermined voltage to at least one of the plurality of memory transistors thereon. The second region of the substrate has a higher impurity concentration than the first region.

According to an aspect of the invention, a memory device comprises a semiconductor substrate and an impurity region formed to a predetermined depth in the semiconductor substrate. The impurity region has a higher impurity concentration than the other region of the substrate other than the impurity region. The other region has a plurality of memory transistors disposed thereon. The impurity region has a selection transistor to supply a predetermined voltage to at least one of the pluralities of memory transistors.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A memory device comprising:
a P-type silicon substrate;
a cell block region formed in a predetermined region of the silicon substrate, the cell block region having a plurality of memory transistors provided thereon in a byte unit; and
a selection transistor region having a plurality of selection transistors provided thereon to switch the memory transistors, the selection transistors for each of the plurality of memory transistors,
wherein a P-well is formed in at least one of the cell block region and the selection transistor region, and
wherein each of the plurality of memory transistors comprises:
a floating gate electrode formed on the semiconductor substrate;

a control gate electrode formed on the floating gate electrode;

an inter-gate-electrode oxide film interposed between the control gate electrode and the floating gate electrode;

a tunnel dielectric film and a gate dielectric film which are interposed between the semiconductor substrate and the floating gate electrode; and a cell junction region formed in the semiconductor substrate below the floating gate electrode.

2. The device of claim 1 wherein the gate electrode of each of the plurality of selection transistors includes the floating gate electrode and the control gate electrode.

3. A memory device comprising:

a P-type silicon substrate;

a cell block region formed in a predetermined region of the silicon substrate, the cell block region having a plurality of memory transistors provided thereon in a byte unit; and a selection transistor region having a plurality of selection transistors provided thereon to switch the memory transistors, the selection transistors for each of the plurality of memory transistors, wherein a P-well is formed in at least one of the cell block region and the selection transistor region, and wherein each of the plurality of selection transistors has an area in the range of about 5 to 7 $\mu m^2$.

* * * * *